US007747936B2

(12) United States Patent
Pistoulet

(10) Patent No.: US 7,747,936 B2
(45) Date of Patent: Jun. 29, 2010

(54) DEVICE FOR PROTECTION AGAINST ERROR INJECTION INTO AN ASYNCHRONOUS LOGIC BLOCK OF AN ELEMENTARY LOGIC MODULE

(75) Inventor: Pierre Pistoulet, Thiais (FR)

(73) Assignee: STMicroelectronics SA, Montrouge (FR)

(*) Notice: Subject to any disclaimer, the term of this patent is extended or adjusted under 35 U.S.C. 154(b) by 1409 days.

(21) Appl. No.: 11/070,850

(22) Filed: Mar. 2, 2005

(65) Prior Publication Data
US 2005/0246600 A1   Nov. 3, 2005

(30) Foreign Application Priority Data
Mar. 2, 2004   (FR)  .................................. 04 02159
Mar. 2, 2004   (FR)  .................................. 04 02160

(51) Int. Cl.
G06F 7/02 (2006.01)

(52) U.S. Cl. ................. 714/820; 375/370; 375/149; 714/703

(58) Field of Classification Search ................. 714/820, 714/703; 375/370, 149
See application file for complete search history.

(56) References Cited

U.S. PATENT DOCUMENTS

| 3,959,770 | A | * | 5/1976 | Schaefer ..................... 714/715 |
| 4,091,410 | A | * | 5/1978 | Citta ........................... 348/726 |
| 4,135,164 | A | * | 1/1979 | Kurata ........................... 331/2 |
| 4,296,494 | A |   | 10/1981 | Ishikawa et al. ............. 371/13 |
| 4,668,900 | A | * | 5/1987 | Tabuchi ....................... 318/608 |
| 4,736,377 | A | * | 4/1988 | Bradley et al. ............... 714/703 |
| 5,001,712 | A | * | 3/1991 | Splett et al. .................. 714/703 |
| 5,400,366 | A | * | 3/1995 | Iwamatsu ..................... 375/344 |
| 5,418,930 | A | * | 5/1995 | Swarts ........................... 703/23 |
| 5,491,479 | A |   | 2/1996 | Wilkinson ..................... 341/58 |
| 5,493,242 | A |   | 2/1996 | Simmons et al. |
| 5,606,564 | A |   | 2/1997 | Ho et al. |
| 5,694,371 | A | * | 12/1997 | Kawaguchi ............. 365/233.11 |
| 5,802,266 | A | * | 9/1998 | Kanekawa et al. ............. 714/11 |
| 5,920,563 | A | * | 7/1999 | Fukui et al. ............... 370/395.5 |
| 5,948,080 | A | * | 9/1999 | Baker ........................... 710/37 |
| 5,996,104 | A |   | 11/1999 | Herzberg ..................... 714/755 |
| 6,024,486 | A | * | 2/2000 | Olarig et al. ................. 714/763 |
| 6,161,202 | A |   | 12/2000 | Kuntzsch et al. ............. 714/51 |
| 6,173,416 | B1 |   | 1/2001 | Liddell et al. ................. 714/11 |
| 6,201,997 | B1 | * | 3/2001 | Giers ........................... 700/79 |

(Continued)

FOREIGN PATENT DOCUMENTS

EP            0 653 708 A2       5/1995

(Continued)

*Primary Examiner*—M. Mujtaba K Chaudry
*Assistant Examiner*—Enam Ahmed
(74) *Attorney, Agent, or Firm*—Lisa K. Jorgenson; Timothy L. Boller; Seed IP Law Group PLLC

(57) ABSTRACT

A logic circuit comprises a logic module comprising a functional logic block supplying a functional result, and a functional flip-flop receiving the functional result and supplying a synchronous result. A module for checking the functional logic block comprises a checking logic block executing the same logic function as the functional logic block and supplying a checking result, checking synchronous flip-flops for applying data present at the input of the functional logic block to the input of the checking logic block, and means for comparing the functional result and the checking result and for supplying a first error signal.

36 Claims, 10 Drawing Sheets

U.S. PATENT DOCUMENTS

| | | | |
|---|---|---|---|
| 6,260,282 B1 * | 7/2001 | Yuan et al. | 33/1 M |
| 6,546,428 B2 * | 4/2003 | Baber et al. | 709/232 |
| 6,691,286 B1 * | 2/2004 | McElvain et al. | 716/3 |
| 6,883,037 B2 * | 4/2005 | Kadatch et al. | 710/5 |
| 6,938,183 B2 * | 8/2005 | Bickel | 714/12 |
| 2005/0235179 A1 | 10/2005 | Pistoulet | |

FOREIGN PATENT DOCUMENTS

JP  9-219698  8/1997

* cited by examiner

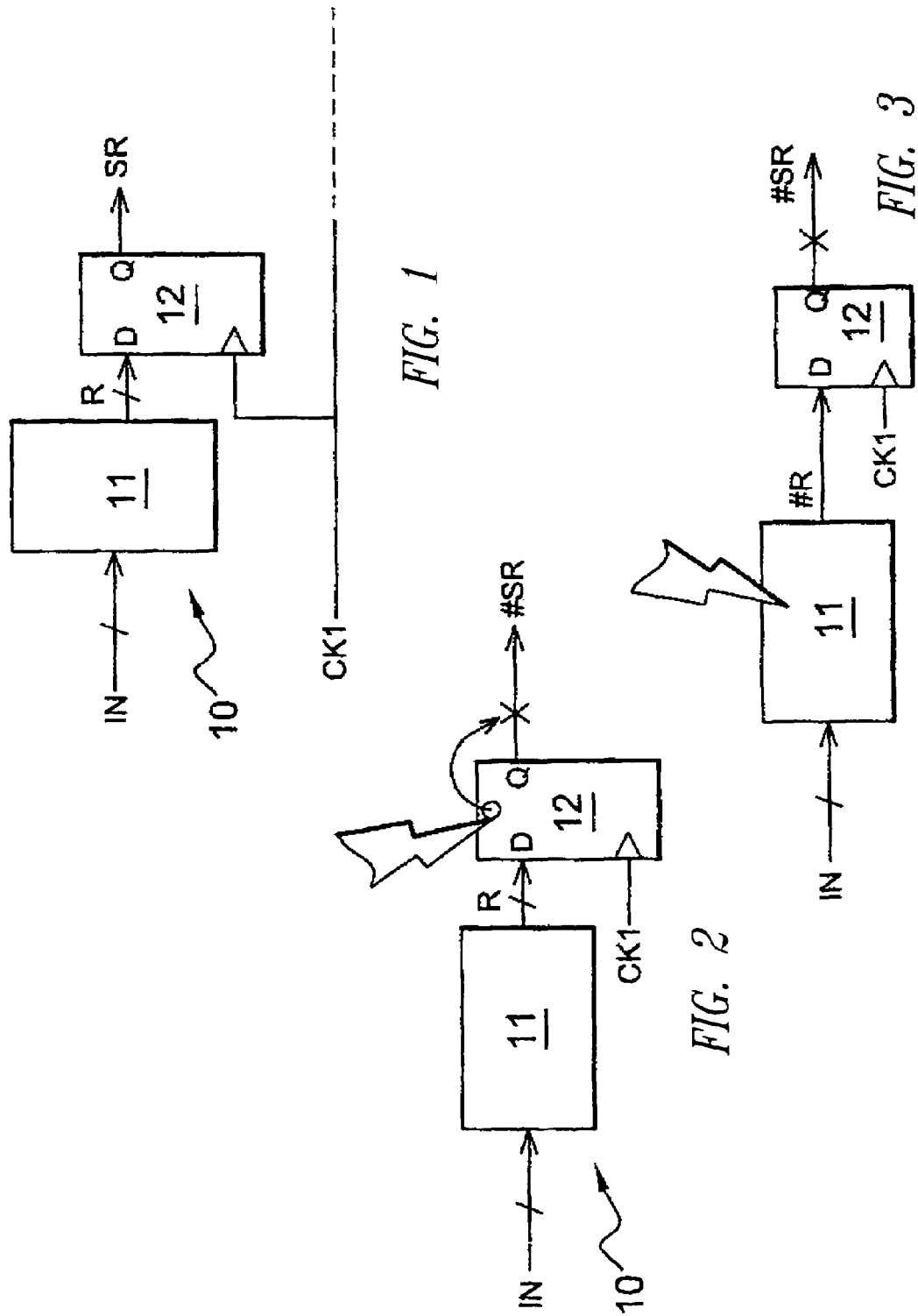

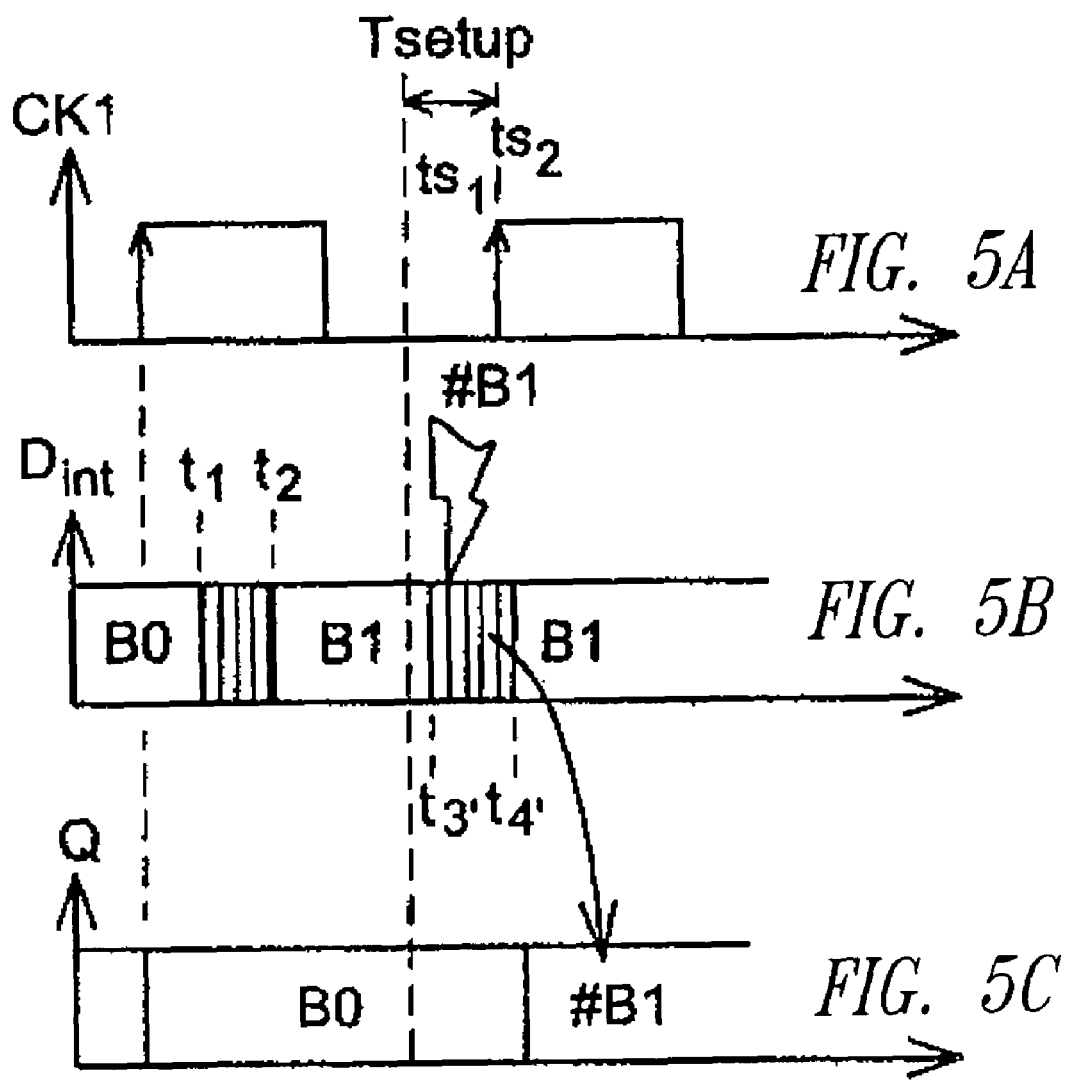

DEVICE FOR PROTECTION AGAINST ERROR INJECTION INTO AN ASYNCHRONOUS LOGIC BLOCK OF AN ELEMENTARY LOGIC MODULE

BACKGROUND OF THE INVENTION

1. Field of the Invention

The present invention relates to the protection of logic circuits against attacks by error injection.

2. Description of the Related Art

The logic circuits present in secured integrated circuits such as integrated circuits for smart cards, are the subject of various attacks by fraudors who try to discover their structure and/or the secrets they contain. They are for example cryptography circuits of DES, AES, RSA or other types, microprocessors programmed to execute cryptography algorithms, register banks containing secret keys, etc.

Such attacks may occur during so-called sensitive calculation phases, such as during the phases of calculating an identification code or during the reading of a cryptography key in a memory for example.

Out of the various attacks known, the attack by fault injection, or error injection, is often used by fraudors. There are localized attacks, concerning one or more bits, and "all on 1"- or "all on 0"-type attacks which aim to force a set of bits at a determined point of the circuit to a same logic value. These attacks can be performed by introducing glitches into the supply voltage of the circuit, by applying a laser beam or an X-ray beam at determined points of the circuit, etc. Some attacks are performed on the back of the silicon microchip of the integrated circuit, by applying determined electric potentials. Such attacks thus enable the behavior of the circuit to be observed, such as the modification of an output code according to the attack for example, and its structure to be deduced therefrom.

To counter such attacks, methods of securization by software redundancy and methods of securization by hardware redundancy and majority vote are known. Software redundancy involves a software re-calculation of the result supplied by the logic circuit, the redundant calculation being performed by microprocessor. However, this method is not entirely satisfactory since the microprocessor is not itself protected from a fault injection, particularly in its data paths and register banks. Furthermore, it is often impossible to perform certain data processing operations by software. Moreover, hardware redundancy with majority election involves reproducing in several copies certain sensitive parts of the logic circuit, and selecting, out of all of the results supplied by the redundant circuits, the majority result. The disadvantage of this method is that it requires occupying a substantial surface area of silicon and requires providing means for identifying and selecting the majority result.

BRIEF SUMMARY OF THE INVENTION

In one aspect, a logic circuit is secured against fault injection, and produces an error signal when an anomaly is detected.

In another aspect, an embodiment of the present invention provides a means for checking the integrity of the output of the asynchronous logic block of a logic module, so as to detect attacks by fault injection onto an internal node of the asynchronous logic block.

In another aspect, a logic circuit comprises at least one logic module comprising a functional synchronous flip-flop receiving a functional result comprising several bits in parallel and supplying a synchronous result that copies the functional result, and a first module for checking the integrity of the functional flip-flop, comprising: a first coding block receiving the functional result and supplying a first code of a number of bits lower than or equal to the number of bits of the functional result, a second coding block receiving the synchronous result and supplying a second code of a number of bits lower than or equal to the number of bits of the synchronous result, a checking synchronous flip-flop receiving the first code and supplying a third code that copies the second code, and a comparator for comparing the second code with the third code, and for supplying a first error signal having an active value when the second code and the third code are not identical.

According to one embodiment, the logic circuit comprises a second module for checking the integrity of the functional flip-flop, comprising: a means for supplying at least a first reference bit using the functional result, an inverter for supplying a first inverted reference bit using the first reference bit, a first checking synchronous flip-flop receiving the first reference bit and supplying a second reference bit that copies the first reference bit, a second checking synchronous flip-flop receiving the first inverted reference bit and supplying a third reference bit that copies the first inverted reference bit, a comparator for comparing the second reference bit and the third reference bit and for supplying a second error signal having an active value when the second reference bit and the third reference bit are identical.

According to one embodiment, the second checking module comprises a first coding block receiving all or part of the functional result and supplying a code forming the first reference bit.

According to one embodiment, the logic circuit comprises a combination of the first checking module and the second checking module, and a logic gate for combining the first error signal and the second error signal and for supplying a general error signal having an active value when at least the first or the second error signal has the active value.

According to one embodiment, the means for supplying at least the reference bit of the second module is the first coding block of the first checking module.

According to one embodiment, the logic circuit comprises a functional asynchronous logic block executing a determined logic function and comprising at least one data input and one output supplying the functional result, and a third module for checking the integrity of the functional logic block, comprising: a checking asynchronous logic block executing the same logic function as the functional logic block, comprising at least one data input and one output supplying a checking result, checking synchronous flip-flops for applying data present at the input of the functional logic block to the input of the checking logic block, and means for comparing the functional result and the checking result and for supplying a third error signal having an active value when the functional result and the checking result are not identical.

According to one embodiment, the third checking module comprises: a first coding block receiving the synchronous result and supplying a first output code comprising a number of bits lower than or equal to the number of bits of the synchronous result, a second coding block receiving the checking result and supplying a second output code comprising a number of bits lower than or equal to the number of bits of the checking result, and a comparator for comparing the first output code and the second output code, and for supplying the third error signal.

According to one embodiment, the checking logic block is a reduced logic block that comprises at least one reduced input and one reduced output each comprising a number of bits lower than the corresponding input and the corresponding output of the functional logic block, and which performs, relative to its inputs, the same logic function as the functional logic block, and the third checking module comprises: at least one coding block linked at input to the input of the functional logic block, supplying an input code that is applied to the reduced input of the checking logic block through the checking flip-flops, a coding block receiving the synchronous result and supplying a first output code comprising a number of bits lower than or equal to the number of bits of the synchronous result, and a comparator having an input receiving the first output code and another input linked to the output of the checking logic block, to supply the third error signal.

According to one embodiment, the checking logic block supplies a checking result that is directly applied to the comparator to be compared to the first output code.

According to one embodiment, the checking logic block supplies a checking result that is applied to the input of a coding block the output of which supplies a second output code that is applied to the comparator to be compared to the first output code.

According to one embodiment, the functional logic block comprises at least one control input receiving a control signal comprising one or more bits, and the checking logic block comprises a control input that receives the control signal through a checking synchronous flip-flop.

According to one embodiment, the coding blocks are logic circuits each supplying a parity bit.

According to one embodiment, the coding blocks are circuits supplying a Hamming code.

According to one embodiment, the functional and checking flip-flops are driven by a common clock signal.

According to one embodiment, the functional flip-flops are driven by a first clock signal and the checking flip-flops are driven by a second clock signal that is taken to the checking flip-flops via a specific clock path.

According to one embodiment, the logic circuit comprises: a plurality of logic modules, a plurality of checking modules each associated with a logic module, and each supplying an error signal, and logic gates for gathering together the error signals supplied by the plurality of checking modules, and for supplying a general error signal.

In one aspect, a logic circuit comprises: a logic module that includes: a functional asynchronous logic block executing a first determined logic function and comprising at least one data input and one output supplying a functional result comprising several bits in parallel; and a functional synchronous flip-flop receiving the functional result and supplying a synchronous result that copies the functional result; and a first module for checking an integrity of the functional asynchronous logic block, the first module including: a reduced asynchronous logic block supplying a checking result and comprising at least one reduced input and one reduced output each comprising a number of bits lower than a corresponding input and a corresponding output of the functional asynchronous logic block, the reduced asynchronous logic block performing, relative to its inputs, a corresponding logic function as the functional asynchronous logic block; checking synchronous flip-flops for applying data present at the input of the functional asynchronous logic block to the input of the reduced asynchronous logic block; and a comparison circuit receiving the functional result and the checking result and supplying a first error signal having an active value when the functional result does not correspond to the checking result.

In another aspect, an integrated circuit comprises: a first logic module, including: a first asynchronous logic block configured to receive an input signal and to produce an asynchronous result based at least in part on the input signal; and a first synchronous logic block configured to produce a synchronous result based at least in part on the asynchronous result; and a reduced checking module configured to monitor a reduced input signal and the synchronous result and to produce a first error signal based at least in part on the monitoring.

In another aspect, a method of checking an integrity of an integrated circuit comprises: monitoring an input signal to a first logic module of the integrated circuit; monitoring a synchronous output signal of the first logic module; generating a reduced input signal based on the monitored input signal; generating a reduced synchronous signal based on the reduced input signal; and generating a first error signal based at least in part on the reduced synchronous signal and the synchronous output signal.

In another aspect, an integrated circuit comprises: a first logic block that includes: means for generating a first asynchronous signal; and means for generating a first synchronous signal based at least in part on the first asynchronous signal; and a first checking block that includes: means for generating a reduced input signal from an input signal provided to the means for generating a first asynchronous signal; and means for detecting an error injection directed at the means for generating a first asynchronous signal coupled to the means for generating a reduced input signal.

In another aspect, a method of checking an integrity of an integrated circuit comprises: monitoring an input signal to a first logic module of the integrated circuit; monitoring a synchronous output signal of the first logic module; generating a synchronous checking signal; and generating a first error signal based at least in part on the synchronous checking signal and the synchronous output signal.

In another aspect, an integrated circuit comprises: a first logic block, comprising: means for generating a first asynchronous signal; and means for generating a first synchronous signal based at least in part on the first asynchronous signal; and means for detecting an error injection directed at the means for generating a first asynchronous signal.

These and other objects, features and advantages of embodiments of the present invention will be explained in greater detail in the following description of various embodiments of an integrity-checking device according to the present invention, given in relation with, but not limited to, the following Figures:

BRIEF DESCRIPTION OF THE SEVERAL VIEWS OF THE DRAWINGS

FIG. 1 represents the general structure of a logic circuit elementary logic module;

FIG. 2 shows a first type of fault injection into the elementary logic module;

FIG. 3 shows a second type of fault injection into the elementary logic module;

FIGS. 4A to 4C, 5A to 5C are timing diagrams of logic signals showing two different results of a fault injection of the second type;

DETAILED DESCRIPTION OF THE INVENTION

Figures 4A, 4B, 4C:
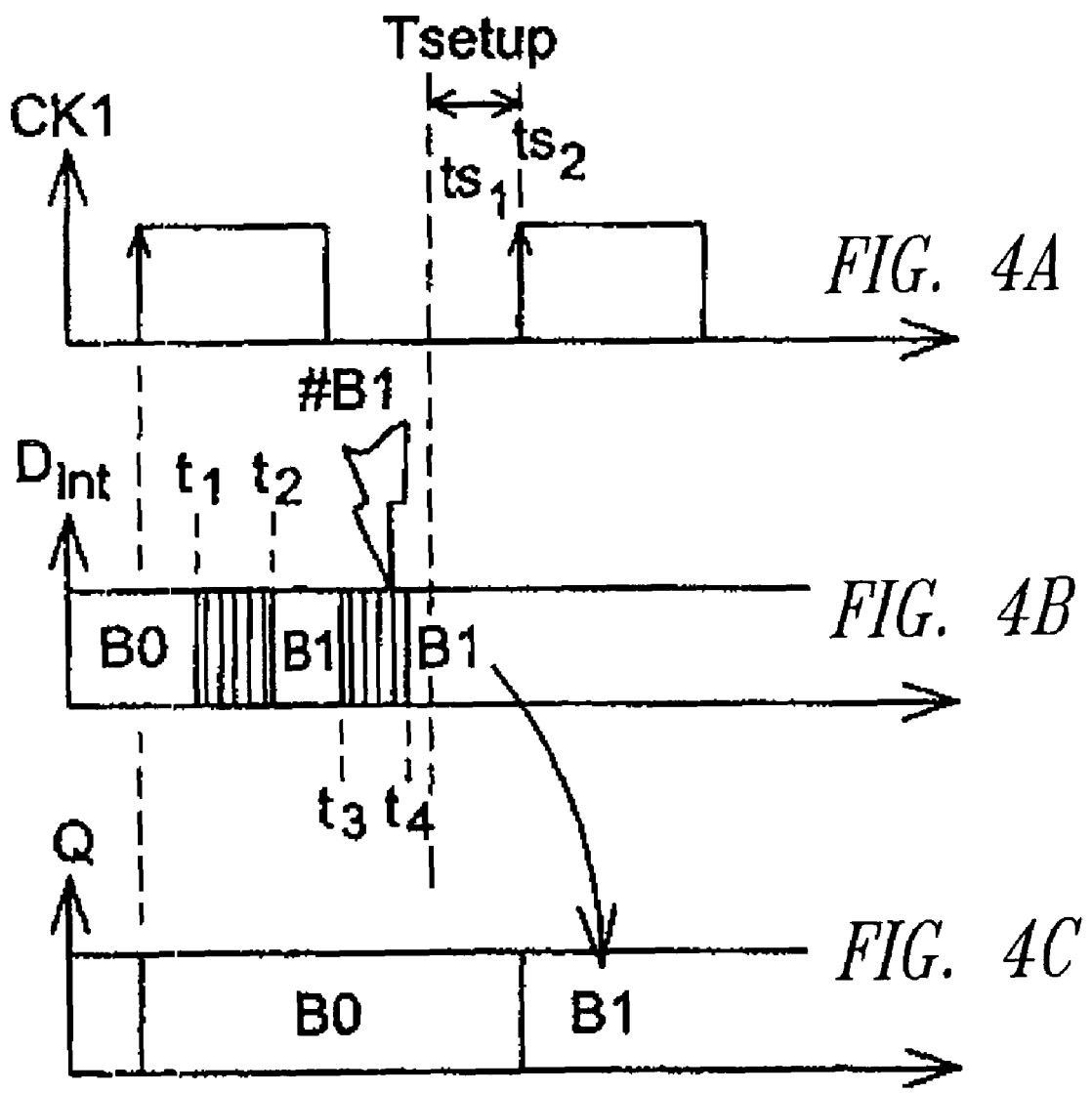

A logic circuit can be broken down into a plurality of elementary logic modules. The present disclosure proposes associating an individual integrity-checking module with each elementary logic module that is to be protected against an attack by fault injection. The logic modules protected by integrity-checking modules may represent only one part of the logic circuit to be secured, for example, particularly parts that are the most sensitive to the fault injection. It can be determined, when designing such a logic circuit, which elementary logic modules will be provided with an integrity-checking module.

A sequential logic circuit comprises a juxtaposition of elementary logic modules having the same general structure, shown in FIG. 1. The elementary logic module 10 represented in this figure comprises an asynchronous logic block 11 in series with a synchronous flip-flop 12 (or D flip-flop) for example. The asynchronous logic block 11 comprises at least one input IN comprising a plurality of bits in parallel, and an output supplying a result R=F(IN) on N bits, F being the logic function executed by the block 11. The flip-flop 12, formed by N flip-flops in parallel of 1 bit each (not represented), comprises a D input of N bits, a Q output of N bits and a synchronization input receiving a clock signal CK0. The D input is linked to the output of the block 11 and the Q output supplies a synchronous result SR that copies the result R upon an edge of the clock signal, such as on each rising edge for example.

Thus, according to this aspect, any logic circuit can be broken down into a plurality of elementary logic modules arranged in series and/or in parallel, each logic module comprising an asynchronous logic block executing a determined logic function. In these conditions, the input IN of the logic block 11 in FIG. 1 is presumed to be linked to the Q output of the flip-flop of another elementary logic module, and the Q output of the flip-flop 12 is presumed to be linked to the input IN of the asynchronous logic block of another elementary logic module. This premise is confirmed in most logic circuits since the recommendations made by the suppliers of RTL code synthesis tools generally lead to obtaining such a logic circuit structure, except as far as the primary inputs and outputs of the logic circuit are concerned.

Thus, an attack by fault injection into such a logic circuit concerns all or part of the elementary logic modules that make up the logic circuit. The analysis of the fault injection mechanism and the search for solutions can therefore, according to an aspect of the present invention, be reduced to the scale of one elementary logic module. Now, on the scale of one elementary logic module, two possibilities are possible: the attack by fault injection is aimed at the synchronous flip-flop 12 or the asynchronous logic block 11. Each of the hypotheses of fault injection is therefore considered separately from the other one.

FIG. 2 shows an example fault injection into the synchronous flip-flop 12. Such a fault injection is performed on an internal node of the flip-flop and the Q output of the flip-flop supplies an invalid synchronous result #SR. For example, according to a classical elementary synchronous flip-flop architecture (not represented), the output voltage of the flip-flop is maintained by two head-to-tail-arranged inverting gates forming a latch and is supplied by a comparator arranged for comparing the voltage present on an internal node of the flip-flop with a threshold voltage. An attack on the internal node leads to the appearance of an invalid value which is retained in the flip-flop by the latch formed by the inverting gates.

FIG. 3 represents an example fault injection aimed at the asynchronous logic block 11. The attack concerns one of the nodes internal to the block 11 or several internal nodes such that the block 11 supplies an invalid result #R although its input IN is deemed to be valid. In this case, the relation R=F(IN) is no longer confirmed.

FIGS. 4A-4C, 5A-5C show two distinct scenarios of a fault injection at input of the flip-flop, due to a fault injected into the asynchronous logic block 11 and also being found in the result R. FIGS. 4A-4C show the case of a fault injection remaining ineffective on the synchronous result SR, and FIGS. 5A-5C show the case of a fault injection having an effect on the synchronous result SR. FIGS. 4A, 5A represent the clock signal CK1, FIGS. 4B, 5B represent the value of a bit B on an internal node Dint of the flip-flop, and FIGS. 3C, 4C represent the value of the Q output of the flip-flop.

The flip-flop has a stabilization window Tsetup delimited by instants ts1 and ts2, the instant ts2 corresponding to the appearance of the rising edge of the clock signal CK1. The value of the bit B on the internal node Dint, which is the image of the bit applied to the D input, must be stable before the instant ts1 so as to be copied by the Q output at the moment the rising edge occurs. On FIGS. 4B, 5B, the internal node Dint of the flip-flop has a logic value transition during which the bit B changes from a value B0 to a value B1. The transition from B0 to B1 takes place between instants t1 and t2. The instant t2 must occur before the instant ts1, which marks the start of the stabilization period Tsetup.

On FIG. 4B, an attack of the internal node Dint occurs at an instant t3 and ends at an instant t4 which precedes the instant ts1. The fault injection imposes an invalid bit #B1 on the node Dint, but ends before the instant ts1, such that the internal node Dint goes back to the value B1 (imposed by the D input) before the critical phase Tsetup. Thus, as represented on FIG. 3C, the fault injection remains ineffective as it is the bit B1 that is copied by the Q output of the flip-flop at the instant ts2.

On FIG. 5B, a fault injection #B1 on the node Dint occurs, on the contrary, between two instants t3' and t4' that are within the window Tsetup. In this case, it is the invalid bit #B1 that is copied by the Q output at the instant ts2, as represented in FIG. 4C. The fault injection is also copied at output when t3'<ts1 and t4'>ts1.

It is therefore possible, according to an embodiment of the present invention, to deduce that a fault injection into the flip-flop 12 can be detected by comparing the value at the D input before the rising edge of the clock signal and the value at the Q output after the rising edge of the clock signal.

Thus, a first object of an embodiment of the present invention is to provide a means for checking the integrity of a synchronous flip-flop of a logic module, so as to detect attacks by fault injection into an internal node of the flip-flop.

In one aspect, an embodiment of the present invention detects a fault injection aimed at the internal nodes of the block 11 by checking that R=F(IN).

Figure 6:
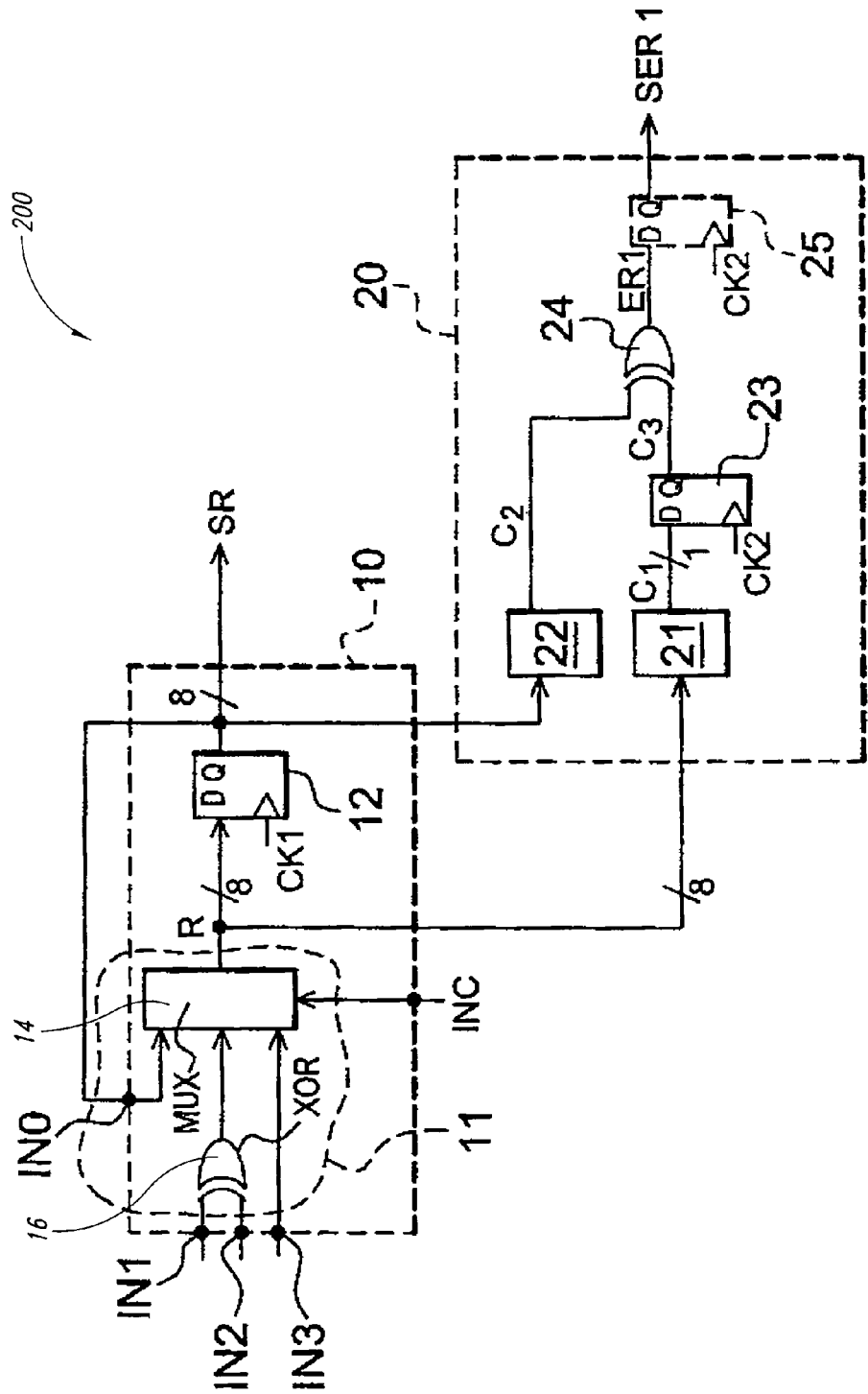
FIG. 6 represents an integrated circuit comprising a first embodiment of a module according to the present invention for checking the integrity of a synchronous flip-flop.

An example of an elementary logic module 10 is represented in FIG. 6 and will be used hereinafter as an example of application of an embodiment of the present invention. The module 10 is here a volatile register element provided for storing an 8-bit datum (byte) and comprises an asynchronous logic block 11 supplying an 8-bit result R, and a synchronous flip-flop 12 comprising 8 elementary synchronous flip-flops of 1 bit each (not represented) arranged in parallel and driven by a clock signal CK1. The result R is applied to the D input of the flip-flop 12, the Q output of which supplies a synchronous result SR. The block 11 here comprises a multiplexer MUX 14 and an XOR gate 16 (Exclusive Or) and has four data inputs IN0, IN1, IN2, IN3 of 8 bits each, and a control input INC of 2 bits. The multiplexer MUX 14 has a first 8-bit data input forming the input IN0 of the block 11, a second data input linked to the output of the XOR gate 16, a third data input forming the input IN3 of the block and a control input forming the control input INC of the block 11. The XOR gate 16, formed by 8 elementary XOR gates each having two 1-bit inputs (not represented), comprises an 8-bit input forming the input IN1 of the block 11 and an 8-bit input forming the input IN2 of the block 11. The output of the XOR gate supplies, to the multiplexer, a word of 8 data bits each bit of which is the result of the bit-by-bit combination of the bits of the same rank present at each of the inputs of the XOR gate 16. The first input of the multiplexer forming the input IN0 of the block is linked to the Q output of the flip-flop 12, and receives the result SR. This input linked to the output of the logic module 10 allows the value of the volatile register to be refreshed at each clock cycle, when no new datum is saved therein. Thus, the result R supplied by the logic block 11 and the synchronous result at output of the module 10 depend on the bits applied to the control input INC and can be equal to the word present on the input IN0, to the word supplied by the XOR gate 16 (bit-by-bit combination by the XOR function of the inputs IN1, IN2) or to the word present at the input IN3.

Examples of embodiments of a module for checking the integrity of the synchronous flip-flop 12 will now be described, followed by examples of embodiments of a module for checking the integrity of the asynchronous logic block 11.

In the description below, such integrity-checking modules will be referred to as "checking modules", on the understanding that the check in question is an integrity check. Furthermore, the elements of an elementary logic module and elements of a checking module will respectively be referred to as "functional" elements and "checking" elements so as to distinguish them. The terms "functional" or "checking" only mean that the element concerned belongs to an elementary logic module to be checked or to a checking module associated with the elementary logic module. Thus, the constituent elements of the module 10 described above, forming a register element, as well as the constituent elements of the checking module 20, are all functional elements in a traditional sense.

EXAMPLE EMBODIMENTS OF MODULES FOR CHECKING THE SYNCHRONOUS FLIP-FLOP

First Example Embodiment

FIG. 6 represents an integrated circuit 200 comprising, in addition to the module 10, a checking module 20 according to an embodiment of the present invention, intended to detect attacks by fault injection into the "functional" flip-flop 12 of the module 10.

The module 20 comprises two coding blocks 21, 22, a "checking" synchronous flip-flop 23 driven by a clock signal CK2, a comparator 24 with two inputs and, optionally, a "checking" synchronous flip-flop 25 represented in dotted lines, also driven by the signal CK2.

The coding blocks 21 and 22 receive at input, respectively, the result R supplied by the asynchronous logic block 11 and the synchronous result SR supplied by the synchronous flip-flop 12. They respectively supply a code C1 and a code C2, here codes of 1 bit each. The codes C1, C2 are for example parity codes. In this case, each coding block 21, 22 comprises a tree of XOR gates (not represented). For example, the block 21 comprises a first XOR gate receiving two first bits of the result R, a second XOR gate receiving the third bit of the result R and the output of the first XOR gate, a third XOR gate receiving the fourth bit of the result R and the output of the second XOR gate, and so on and so forth. The code C1 is therefore a parity bit equal to:

$$C1 = r0 \oplus r1 \oplus r2 \oplus r3 \ldots \oplus r7$$

r0-r7 being the bits of the result R, C1 being equal to 1 if the result R contains an odd number of bits on 1.

The code C1 is applied to a D input of the checking flip-flop 23, the Q output of which supplies a code C3. The codes C1, C3 are applied to the inputs of the comparator 24. The comparator 24, such as an XOR gate for example, supplies an error signal ER1 that is on 0 when the two codes are equal and is on 1 (active value) when the two codes are different. The flip-flop 25 receives the error signal ER1 and supplies a synchronized error signal SER1.

The clock signal CK1 applied to the functional flip-flop 12 and the clock signal CK2 applied to the checking flip-flops 23, 25 are identical and synchronous, and may come from a common clock signal source. However, to ensure additional protection against an injection of errors into the clock path, the path taking the signal CK1 to the functional flip-flop and the path taking the signal CK2 to the checking flip-flops can be different. In this case, the clock paths comprise distinct conductor paths connected to the same clock signal source and have substantially the same temporal properties (phase difference between the incoming clock signal and the outgoing clock signal) such that the switches of functional and checking flip-flops occur substantially at the same instant, although a time difference can be tolerated.

The module 20 detects an attack by error injection into the "functional" flip-flop 12, which affects the synchronous result SR while the result R applied to the input of the flip-flop 12 is valid. In such a case, the value of the result SR is different to that of the result R, the codes C1 and C2 are different, the codes C2 and C3 are also different since the code C3 copies the code C2. The error signal ER1 therefore changes to 1.

For a better understanding, table 1 below describes the propagation process of the signals in the module 20 in the case of an error injection. In table 1, the following notation is used:

P is the coding function, such as the parity function for example,

T1 is the instant at which the result R is refreshed at output of the block 11, ta is the calculation time of the blocks 21, 22 and of the comparator 24 (calculation times taken to be identical for the sake of simplicity)

T2 is the instant at which the first rising edge of the signals CK1, CK2 appears after the instant T1, Ti is the instant at which the error injection occurs, T3 is the instant at which the next rising edge of the signals CK1, CK2 appears, RVAL is the value of the result R at the time t1, and

SRVAL is the invalid value of the synchronous result SR at the time T2, here taken to be different to RVAL due to the error injection into the flip-flop 12.

TABLE 1

|      | T1   | T1 + ta | T2      | Ti      | T2 + ta  | T2 + 2ta | T3 |
|------|------|---------|---------|---------|----------|----------|-----|
| R    | RVAL | RVAL    | —       | —       | —        | —        |     |
| SR   |      |         | SRVAL   | #SRVAL  | —        | —        | —   |
| C1   | —    | P(RVAL) | —       | —       | —        | —        |     |
| C3   |      |         | P(RVAL) | P(RVAL) | P(RVAL)  | —        |     |
| C2   | —    | —       | —       | —       | P(#SRVAL)| —        |     |
| ER1  | —    | —       | —       | —       | —        | 1        | —   |
| SER1 | —    | —       | —       | —       | —        | —        | 1   |

The values that precede or follow the values of the signals appearing in table 1 are not mentioned for the sake of remaining clear and are not useful to understanding the description. These values can be the current values of the clock cycle considered, values of the preceding clock cycle or of the next clock cycle.

It appears that the signal ER1 changes to 1 at an instant T2+2ta occurring between the instants T2 and T3, because the codes C2 and C3 are not identical as a result of the fact that the synchronous result #SRVAL is different to the result RVAL. At the instant T3, the synchronized error signal SER1 changes to 1 at output of the flip-flop 25.

The flip-flop 25 can be arranged outside the checking module and be a collective synchronization flip-flop receiving the result of the combination of several error signals sent by various checking modules according to the present invention, as will be described below.

Second Example Embodiment

Figure 7:
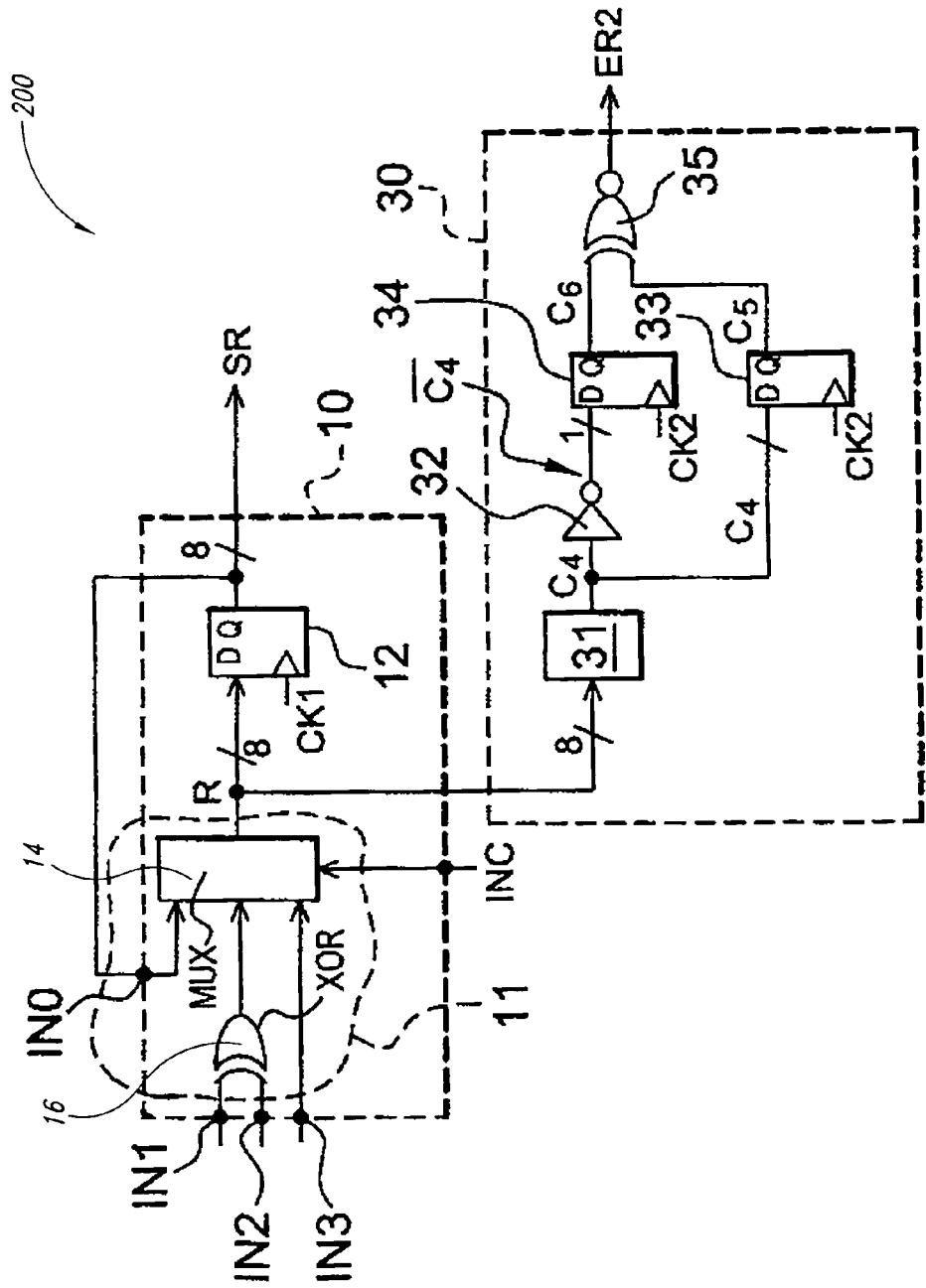
FIG. 7 represents an integrated circuit comprising a second embodiment of a module for checking the integrity of a synchronous flip-flop.

FIG. 7 represents a second embodiment of an integrated circuit 200 comprising an embodiment of a checking module 30 according to the present invention.

The module 30 comprises a coding block 31, an inverting gate 32, two flip-flops 33, 34 driven by the clock signal CK2, and a comparator 35. The coding block 31 receives at input the result R supplied by the asynchronous logic block 11 of the logic module 10. The output of the block 31 supplies a reference bit C4, here a 1-bit parity code. The reference bit C4 is applied to the inverting gate 32 and to a D input of the flip-flop 33. The D input of the flip-flop 34 is linked to the output of the inverting gate 32, which supplies an inverted reference bit/C4. The outputs of the flip-flops 33, 34 respectively supply bits C5, C6 synchronized to the clock signal CK2 and presumed to be different to one another since the bit C5 comes from the bit C4 while the bit C6 comes from the inverted bit/C4. The bits C5, C6 are applied at input of the comparator 35, here a NXOR gate (Exclusive Nor). The comparator supplies an error signal ER2 that is equal to 0 when the bits C5, C6 are different, and which is equal to 1 (active value) if the two bits are equal.

The module 30 allows an attack by fault injection of the "all on 0"- or all on 1-type to be detected. Such a fault injection is aimed at all of the flip-flops from a same zone of a logic circuit. In this case, the bits C5 and C6 are equal and the signal ER2 changes to 1.

The use as a reference bit of the parity bit calculated on all of the bits of the result R offers a high correlation between the reference bit and the result R. The reference bit C4 can however be obtained in various ways other than the one described above. In one alternative embodiment, the reference bit is for example one of the bits of the result R, or is supplied by a logic gate receiving at input all or part of the bits constituting the result R. Several reference bits can also be provided.

Third Example Embodiment

Figure 8:
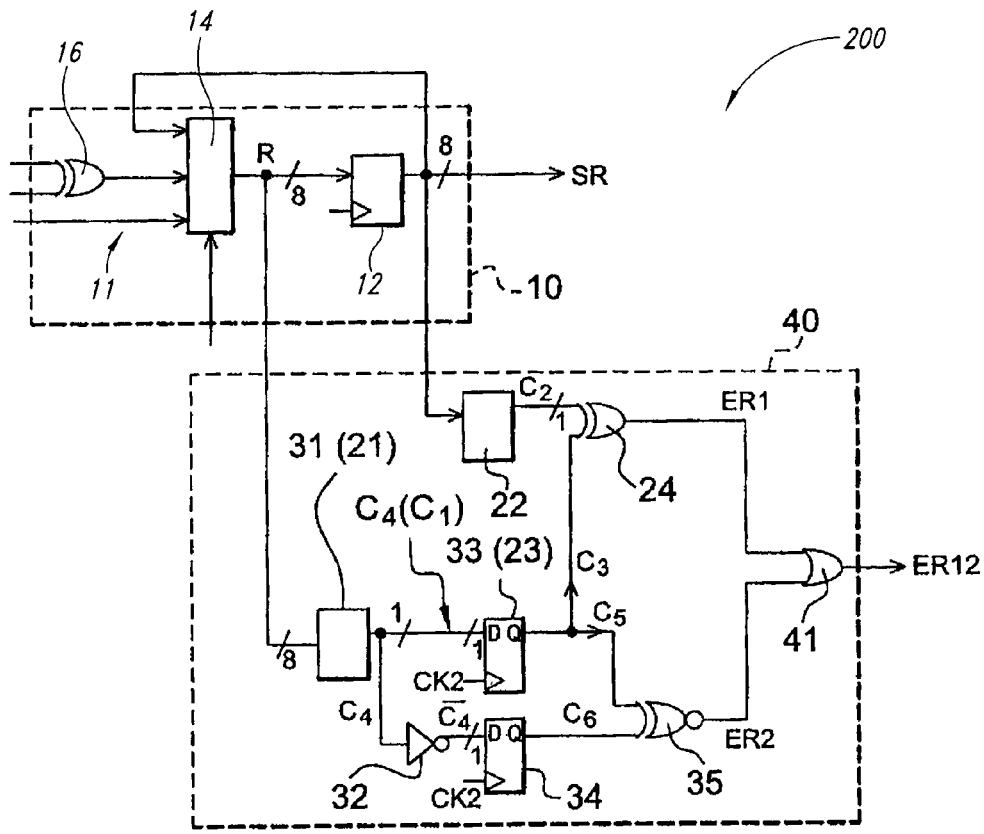
FIG. 8 represents an integrated circuit comprising an embodiment of a module for checking the integrity of a synchronous flip-flop comprising checking modules according to the first and second embodiments represented in FIGS. 6 and 7.

FIG. 8 represents an integrated circuit 200 having a checking module 40 comprising an embodiment of a combination of the two checking modules described above. The module 40 thus comprises the elements of the module 30, i.e., the coding block 31, the inverting gate 32, the gates 33, 34, and the comparator 35 the output of which supplies the error signal ER2. The module 40 also comprises elements of the module 20, i.e., the coding block 22 and the comparator 24 the output of which supplies the error signal ER1. The block 31 and the flip-flop 33 are combined to supply both the bit C5 applied to the comparator 35 and the code C3 applied to the comparator 24 (the bit C5 and the code C3 being identical when the coding blocks supply a parity bit). The block 40 also comprises an OR gate 41 that receives the error signals ER1, ER2 at input and supplies a general error signal ER12. Thus, if one of the two error signals changes to 1 (fault injection into the functional flip-flop 12 or fault injection by setting all of the flip-flops to 0 or to 1), the general error signal ER12 changes to 1.

The implementation of embodiments of the present invention in a complex logic circuit, such as a microprocessor structure, a register structure or a cryptography circuit for example, comprises providing a checking module according to an embodiment of the present invention (for example, the illustrated modules 20, 30 or 40) for each logic module that must be secured against fault injection into the logic circuit.

General Architecture of an Embodiment of an Integrity-Checking Device

Figure 9:
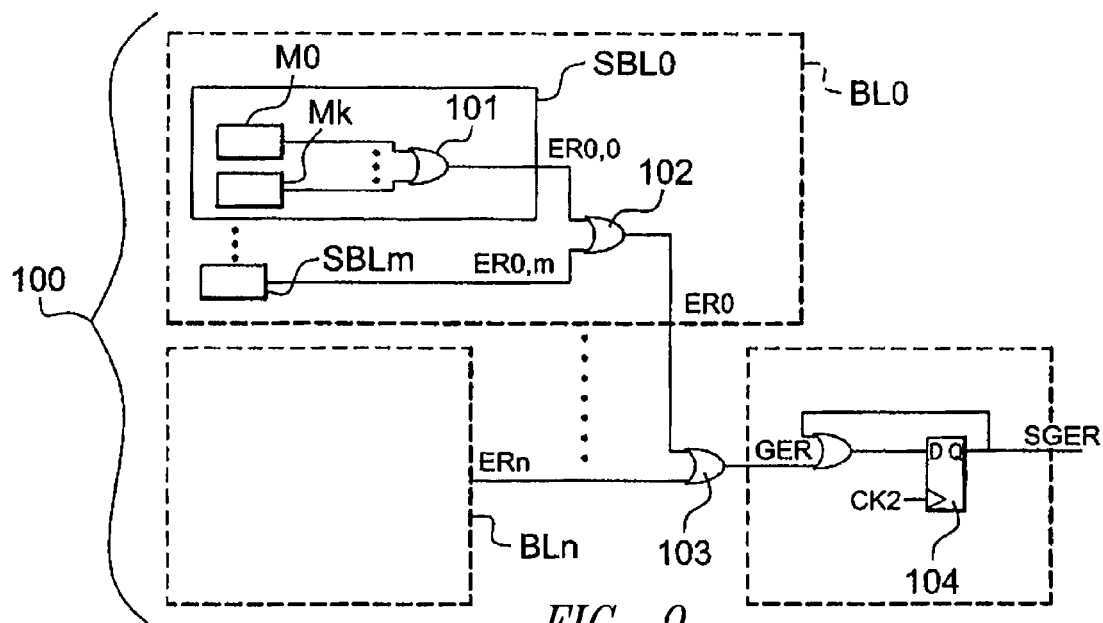
FIG. 9 schematically represents the structure of an integrity-checking device comprising a plurality of integrity-checking modules according to an embodiment of the present invention.

FIG. 9 schematically represents the general architecture of an embodiment of an integrity-checking device 100 according to the present invention. The device is organized in blocks BL0 . . . BLn, each block comprising sub-blocks SBL0 . . . SBLm, each sub-block comprising checking modules M0 . . . Mk, each checking module being associated with an elementary logic module of the logic circuit to be secured (see, for example, the module 10 of FIG. 6). In each sub-block SBL0 . . . SBLm, an OR gate 101 gathers together the individual error signals coming from the checking modules, to obtain sub-block error signals ER0,0 . . . ER0,m. In each block BL0 . . . BLn, the sub-block error signals ER0,0 . . . ER0,m are gathered together by an OR gate 102 which supplies a block error signal ER0 . . . ERn. The block error signals are themselves gathered together by cascade-arranged OR gates schematically represented in the figure by an OR gate 103 with multiple inputs. The output of the gate 103 supplies a general error signal GER applied to a synchronous flip-flop 104 which supplies a synchronous general error signal SGER. This general error signal can be used in various ways to lock the logic circuit under control, particularly during the execution of a so-called sensitive operation. Those skilled in the art will also be able to provide various other ways of producing the general error signal using the error signals coming from checking modules, and various ways of latching this general error signal when an error is detected at a checking module. Those skilled in the art will also be able to provide the conditions for resetting the general error signal, for example upon reset (RESET) or power down of the logic circuit.

The description above was of one aspect of the present invention aiming to detect an error injection into "functional" synchronous flip-flops.

A second aspect of the present invention will now be described which relates to the detection of an error injection into the asynchronous logic block of an elementary logic module.

EXAMPLES EMBODIMENTS OF A MODULE FOR CHECKING AN ASYNCHRONOUS LOGIC BLOCK

First Example Embodiment

Figure 10:
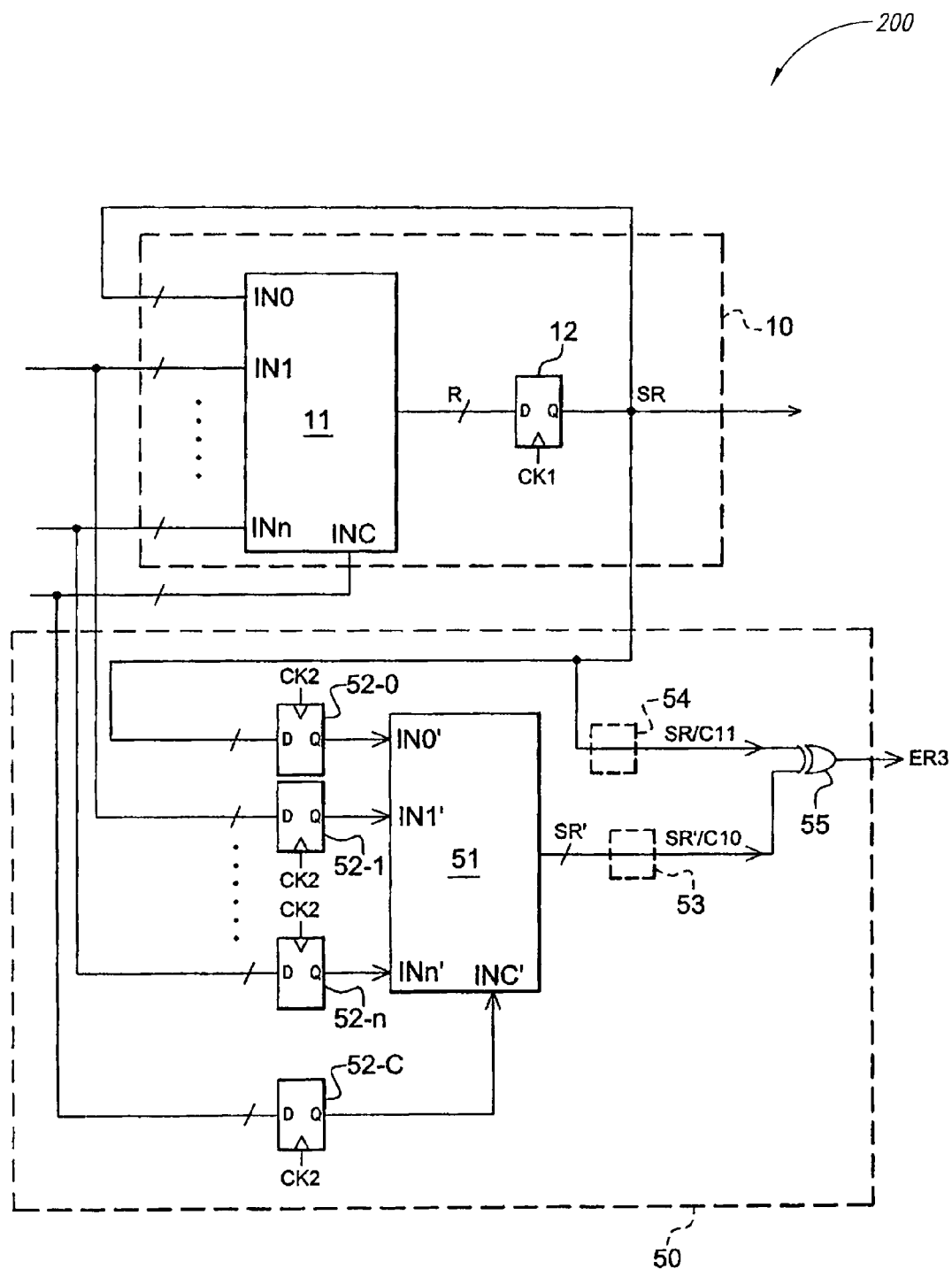
FIG. 10 represents an integrated circuit comprising an embodiment of a module according to the present invention for checking the integrity of an asynchronous logic block.

FIG. 10 represents an integrated circuit 200, having a checking module 50 according to an embodiment the present invention linked to a logic module 10 comprising an asynchronous logic block 11 and a synchronous flip-flop 12. The output of the block 11 supplies as above a result R to the D input of the flip-flop 12, the output of which supplies the synchronous result SR. The block 11 here comprises data inputs IN0, IN1 . . . Nn and a control input INC. The input IN0 is here linked to the Q output of the flip-flop 12, and receives the synchronous result SR. The results R and SR are, for example, 8-bit words.

The module 50 comprises a "checking" logic block 51 and synchronous flip-flops 52-0, 52-1, . . . 52-n, 52-C.

The "checking" logic block 51 is the image of the "functional" logic block 11 and has inputs IN0', IN1'. . . INn', INC' corresponding to the inputs IN0, IN1 . . . INn, INC' of the block 11. Its output supplies a "checking" synchronous result SR' by applying the same asynchronous logic function as the "functional" block 11. The inputs IN0' to INn', INC' are linked to the corresponding inputs of the block 11 through the flip-flops 52-0, 52-1, . . . 52-n, 52-C. Thus, the input IN0' is linked to the input IN0 through the flip-flop 52-0, the input IN1' is linked to the input IN1 through the flip-flop 52-1, etc., the input INn' is linked to the input INn through the flip-flop 52-n, and the input INC' is linked to the input INC through the flip-flop 52-C.

The "checking" flip-flops 52-0 to 52-n, 52-C are driven by the clock signal CK2 described above. Each flip-flop 52 comprises a number of elementary flip-flops (1-bit flip-flops) equal to the number of bits that the corresponding input of the "checking" logic block 51 has.

The "checking" logic block 51 thus supplies, with a time difference of 1 clock cycle, a result SR' presumed to be identical to the synchronous result SR at output of the flip-flop 12.

The module 50 also comprises a comparator 55, for example an XOR gate with two inputs, here two inputs of 8 bits each, the first input receiving the "checking" synchronous result SR and the second input receiving the "functional" synchronous result SR. The comparator 55 supplies an error signal ER3 that is equal to 1 (active value) when the results SR, SR' are different.

In one alternative embodiment represented by dotted lines in the Figure, coding blocks 53, 54 are arranged at input of the comparator 55. The coding block 53 receives the checking result SR' and supplies to the first input of the comparator 55 a code C10 that varies according to SR', here a 1-bit code, such as a parity code for example. The block 54, which is identical to the block 53, receives the functional result SR and supplies a code C11, here of 1 bit, such as a parity code for example, to the second input of the comparator. In this alternative, the comparator 55 is for example an elementary XOR gate with two inputs of 1 bit each.

The module 50 allows an attack by error injection into the "functional" logic block 11 to be detected, which affects the result R while the imputs IN0-INn, INC are taken to be valid. In such a case, the value of the synchronous result SR is different to that of the "checking" result SR', the codes C10 and C11 are different, and the error signal ER3 changes to 1.

For a better understanding, table 2 below describes the propagation process of the signals in the module 50 in the case of an error injection. In table 2, the following notation is used:

T1 is the instant at which the inputs IN0 to INn, INC are refreshed,

I0 to In, IC are the values of the inputs IN0 to INn, INC, at the instant T1, ta is the calculation time of the asynchronous blocks 11, 51, of the coding blocks 53, 54, and of the comparator 55 (taken to be identical for the sake of simplicity),

RVAL is the invalid value of the result R at output of the block, due to an error injection into the block 11, T2 is the instant at which the first clock edge CK1, CK2 after the instant T1 appears, RVAL is the valid value of the result SR' at output of the checking logic block 51, P(RVAL) is the value of the code C10 obtained using the value RVAL, P(#RVAL) is the value of the code C11 obtained using #RVAL.

TABLE 2

|   | T1 | T1+ta | T2 | T2+ta | T2+2ta | T2+3ta |
|---|---|---|---|---|---|---|
| IN0-INn | I0-In | I0-In | — | — | — | — |
| INC | IC | IC | — | — | — | — |
| R |  | #RVAL | #RVAL | — | — | — |
| SR | — | — | #RVAL | #RVAL | #RVAL | #RVAL |
| C11 | — | — | — | P(#RVAL) | P(#RVAL) | P(#RVAL) |
| IN0'-INn' | — | — | I0-In | I0-In | I0-In | I0-In |
| INC' | — | — | IC | IC | IC | IC |
| SR' | — | — | — | RVAL | RVAL | RVAL |
| C10 | — | — | — | — | P(RVAL) | P(RVAL) |
| ER3 | — | — | — | — | — | 1 |

The values that precede or follow the values indicated in table 2 are not mentioned for the sake of remaining clear and are not useful to understanding the description. These values can be the values of the current clock cycle, of the preceding clock cycle or of the next clock cycle.

It can be seen that the invalid functional result #RVAL, which appears at the instant T1+ta at output of the functional block, propagates to the output of the functional flip-flop 12 at the moment T2 while at the same instant the inputs IN0-INn, INC, which are valid, are sampled by the checking flip-flops 52-0 to 52-n, 52-C at the input of the checking block 51. The invalid result #RVAL then propagates to the output of the coding block 54 at T2+ta to form an invalid (P(#RVAL)) code C11 while at the same instant the valid checking result RVAL settles at the output of the block 51. At the instant T2+2ta the code C10 settles at the output of the block 53 and at the instant T2+3ta the error signal ER3 changes to 1.

As above, a flip-flop for synchronizing the signal ER3 can be arranged at the output of the comparator 55.

Second Example Embodiment

Figure 11:
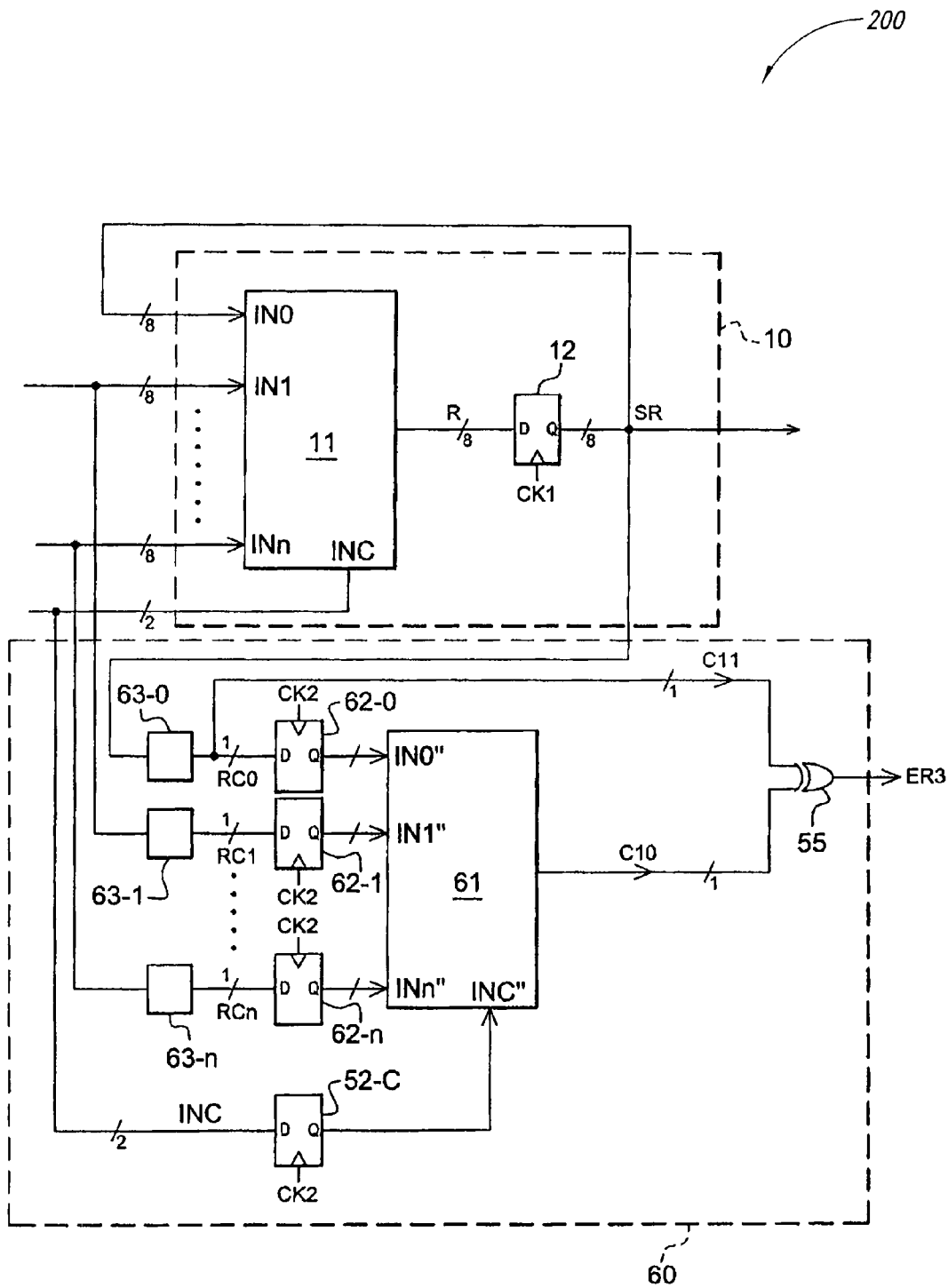
FIG. 11 represents an integrated circuit comprising another embodiment of a module for checking the integrity of an asynchronous logic block.

A second example embodiment of a checking module 60, illustrated in FIG. 11, reduces the size and space requirement of the "checking" logic block. To that end, the "checking" logic block 51 described above is replaced by a reduced logic block 61 that performs the same logic function as the functional block 11 but with a smaller number of bits at input and at output. Thus, the block 61 has reduced inputs IN0", IN1"... INn" each having a number of bits in parallel that is smaller than that of the inputs IN0, IN1 ... INn of the functional block 11. The block 61 nonetheless has a control input INC" identical to the input INC of the block 11, so as to be able to perform the same logic function, when the number of control bits cannot be reduced.

The reduced inputs are for example 1-bit inputs instead of 8-bit inputs. The checking flip-flops 52-0 to 52-n, 52-C of the previous embodiment, which were 8-bit flip-flops (each comprising 8 elementary 1-bit flip-flops), are replaced by flip-flops 62-0 to 62-n of 1 bit each, i.e., elementary flip-flops, again driven by the clock signal CK2. The flip-flop 52-C is kept since the control input INC is not reduced.

The module 60 further comprises coding blocks 63-0, 63-1, ... 63-n arranged between the inputs IN0, IN1, ... INC of the functional block 11 and the D inputs of the flip-flops 62-0, 62-1, ... 62-n. The coding blocks supply reduced input codes RC0, RC1 ... RCn having a number of bits corresponding to the number of bits of the inputs IN0', IN1'... INn' of the reduced logic block 61. These reduced codes are here codes of 1 bit each, such as parity bits for example.

The output of the block 61 supplies the transform of the parity bits RC0, RC1 ... RCn obtained by the logic function of the block, i.e., the parity code of the transform of the non-reduced inputs obtained by the logic function of the block. Thus, the output of the block 61 supplies the code C10 described above directly, which is applied to the comparator 55. The code C11 is taken off here at the output of the coding block 63-0, which here receives the synchronous result SR (since the synchronous result SR of the logic module 10 is taken back to the functional input IN0 of the logic block 11 and is, consequently, also taken back to the coding block 63-0). The result ER3 is therefore identical to the one described above (cf. table 2). The size of the "checking" logic block 61 is here reduced by 8 relative to that of the "checking" logic block 51.

Third Example Embodiment

Figure 12:
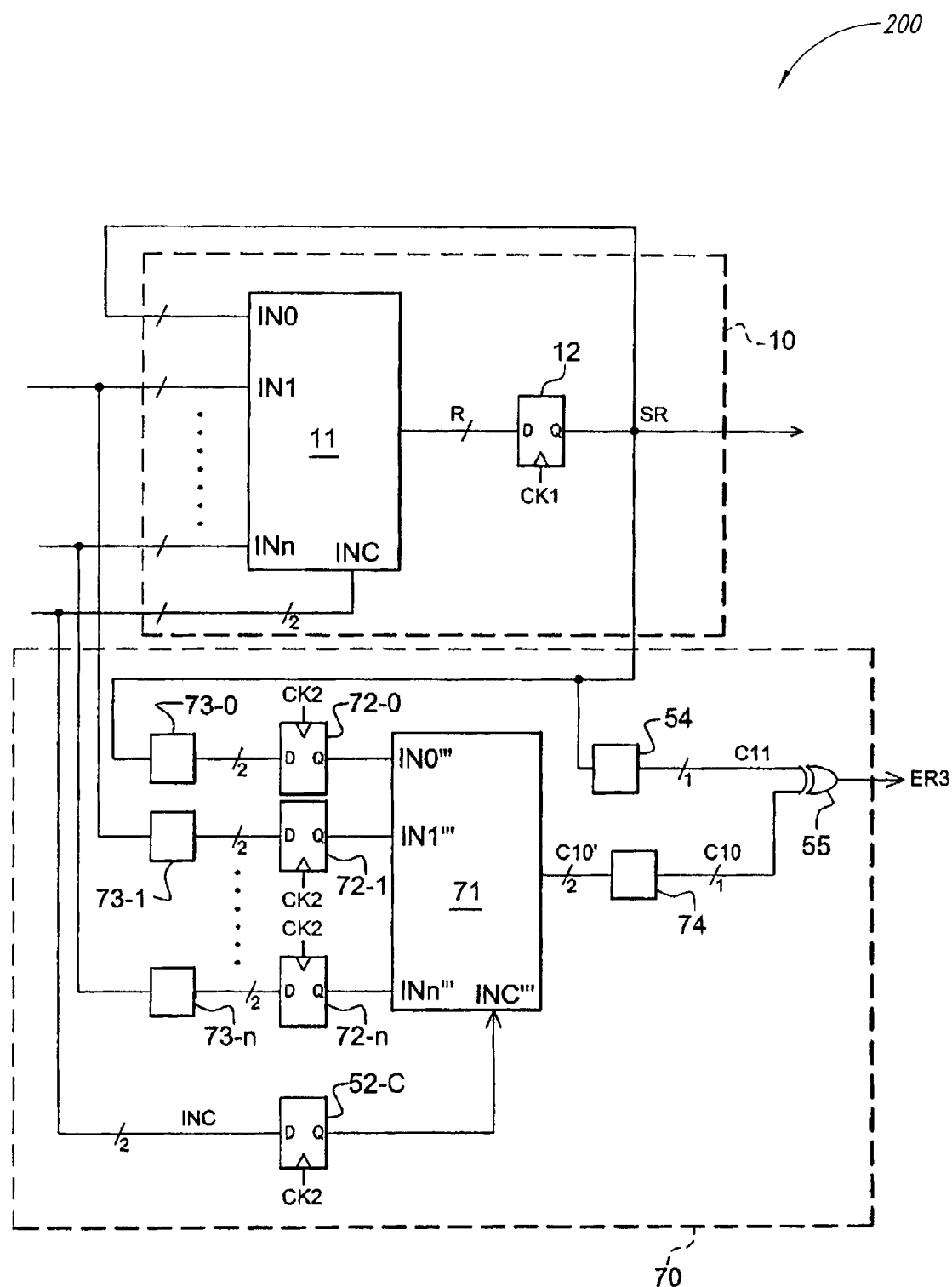
FIG. 12 represents an integrated circuit comprising another embodiment of a module for checking the integrity of an asynchronous logic block.

The checking module 70 represented in FIG. 12 is an example intermediary embodiment between the two embodiments described above. It comprises a reduced logic block 71 comprising inputs IN0''', IN1'''... INn''' each having a number of bits in parallel that is greater than the number of bits of the inputs IN0",IN1"... INn" of the checking block 61 (FIG. 11) but which is smaller than the number of bits of the inputs IN0, IN1 ... INn of the functional block 11, such as 2 bits for example. The coding blocks 63-0 to 63-n are replaced by coding blocks 73-0 to 73-n supplying an appropriate number of bits. The flip-flops 62-0 to 62-n are replaced by flip-flops 72-0 to 72-n each capable of receiving an appropriate number of bits. The output of the block 71 supplies a code C10' that comprises a number of bits in parallel that is greater than that of the code C11, which is again supplied here by the coding block 54 described above. The output of the block 71 is applied to a coding block 74 that reduces the number of bits of the code C10' to supply the code C10 comprising a number of bits identical to the one that the code C11 comprises, such as 1 bit for example. The codes C10, C11 are applied as above to the comparator 55, to obtain the error signal ER3.

EXAMPLE COMBINATION EMBODIMENT

Figure 13:
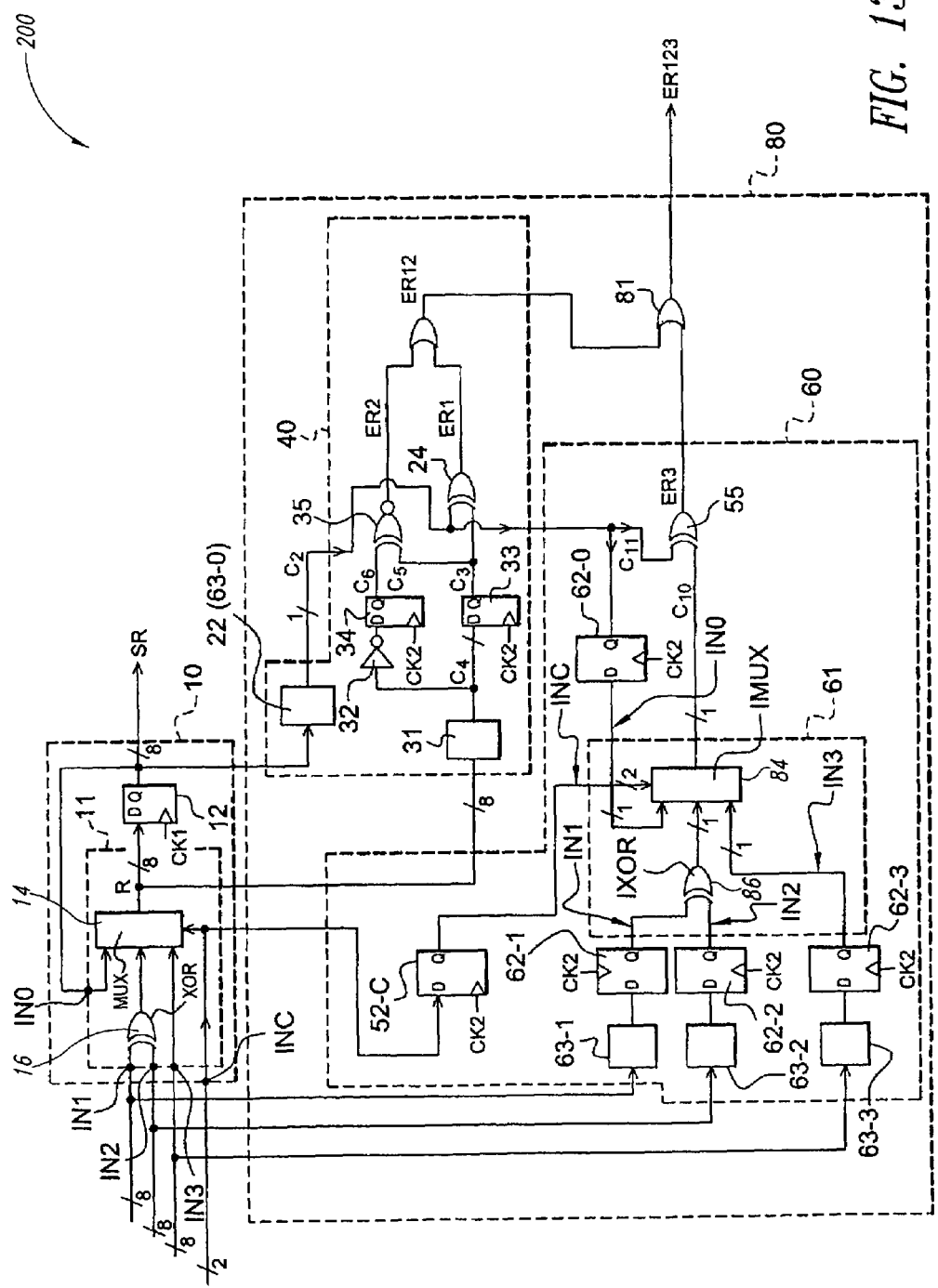
FIG. 13 represents an integrated circuit comprising an example of an embodiment of an integrity-checking module comprising modules for checking the integrity of a synchronous flip-flop and for checking the integrity of an asynchronous logic block.

FIG. 13 represents an embodiment of an integrated circuit 200 having a checking module 80 that embodies a combination of the aspects of the embodiments described above. The module 80 is here associated with the elementary logic module 10 forming a register element, the structure of which has already been described. The functional logic block 11 thus comprises the multiplexer MUX 14 and the XOR gate 16, the synchronous result SR being taken back to the input IN0 of the multiplexer 14.

The module 80 comprises the module 40 already described, which will not be described again, the same elements being designated by the same references. The module 40 itself comprises a combination of the modules 20, 30 described above.

The module 80 also comprises the module 60 the general structure of which has also been described above. The "checking" logic block 61 of the module 60 here comprises a reduced multiplexer IMUX 84 only comprising three data inputs of 1 bit each, and a reduced XOR gate 86, designated IXOR 86, only comprising two inputs of 1 bit each.

The module 60 also comprises "checking" synchronous flip-flops 62-0, 62-1, 62-2, 62-3 of 1 bit each, a "checking" synchronous flip-flop 62-C of two bits, and coding blocks 63-1, 63-2, 63-3 having 8 bits at input and 1 bit at output, here parity calculation blocks (trees of XOR gates). The 2-bit control input of the multiplexer MUX 14 is linked to the 2-bit control input of the multiplexer IMUX 84 through the flip-flop 62-C. The 8-bit inputs IN1, IN2, IN3 of the "functional" logic block 11 are linked to the inputs of the coding blocks 63-1, 63-2, 63-3, respectively. The outputs of the coding blocks 63-1, 63-2, 63-3, of 1 bit each, are linked to the corresponding inputs of the "checking" block 61 through the "checking" flip-flops 62-1, 62-2, 62-3, respectively. The coding block 22 of the module 40 is here used as coding block 63-0 of the module 60, such that the code C2 of the module 40 also forms the code C11 of the module 60. The code C11 is applied to an input of the comparator 55 that receives at its other input the output of the reduced multiplexer IMUX 84, i.e., the code C10. The code C11 is also applied to the first input of the multiplexer IMUX 84 through the flip-flop 62-0.

Finally, the module 80 comprises an OR gate 81 that receives the error signal ER12 coming from the module 40 and the error signal ER3 from the module 60, and which supplies a general error signal ER123 that changes to 1 as soon as an attack is detected in the functional flip-flop 12 and/or in the functional logic block 11. As indicated above, this signal can be combined with signals of other modules to form a sub-group signal, itself combined with other sub-group signals to form group signals, etc., until a general error signal is obtained that concerns an entire complex logic circuit, such as, for example, an integrated circuit.

It will be understood by those skilled in the art that various alternative embodiments of the present invention may be made. Particularly, the coding blocks, which allow the number of bits for the comparison of the functional and checking results to be reduced, can be of any known type, such as coding blocks supplying Hamming codes that are, just like parity codes, extensively used in data securization methods.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A logic circuit, comprising:
a logic module that includes:
   a functional asynchronous logic block executing a first determined logic function and comprising at least one data input of a number of bits and one output supplying a functional result comprising a number of bits in parallel; and
   a functional synchronous flip-flop receiving the functional result and supplying a synchronous result that copies the functional result; and
a first module for checking an integrity of the functional asynchronous logic block, the first module including:
   a reduced asynchronous logic block supplying a checking result and comprising an input having a number of bits which is less than the number of bits of the at least one data input of the functional asynchronous logic block and an output having a number of bits which is less than the number of bits of the functional result of the functional asynchronous logic block, the reduced asynchronous logic block performing, relative to its inputs, a corresponding logic function as the functional asynchronous logic block;
   checking synchronous flip-flops for applying data present at the input of the functional asynchronous logic block to the input of the reduced asynchronous logic block; and
   a comparison circuit receiving the functional result and the checking result and supplying a first error signal having an active value when the functional result does not correspond to the checking result.

2. The logic circuit according to claim 1, wherein the comparison circuit comprises:
   at least one first coding block linked at an input to the input of the functional asynchronous logic block, supplying an input code that is applied to the input of the reduced asynchronous logic block through the checking flip-flops;
   at least one second coding block receiving the synchronous result and supplying a first output code comprising a number of bits lower than or equal to a number of bits of the synchronous result; and
   a comparator having an input receiving the first output code, another input coupled to the output of the reduced asynchronous logic block, and an output for supplying the first error signal.

3. The logic circuit according to claim 2, wherein the reduced asynchronous logic block supplies a second output code that is applied to the comparator to be compared with the first output code.

4. The logic circuit according to claim 2, wherein the reduced asynchronous logic block supplies a checking result that is applied to an input of a coding block, an output of which supplies a second output code that is applied to the comparator to be compared with the first output code.

5. The logic circuit according to claim 1, wherein the comparator circuit is configured to supply a first error signal having an active value when the bits of the reduced output are not identical to the corresponding bits of the functional result.

6. The logic circuit according to claim 1, wherein:
   the functional asynchronous logic block comprises at least one control input receiving a control signal comprising one or more bits; and
   the reduced asynchronous logic block comprises a control input that receives the control signal through a checking synchronous flip-flop.

7. The logic circuit according to claim 1, comprising a second module for checking an integrity of the functional flip-flop, the second module including:
   a first coding block receiving the functional result and supplying a first code of a number of bits lower than or equal to a number of bits of the functional result;
   a second coding block receiving the synchronous result and supplying a second code of a number of bits lower than or equal to a number of bits of the synchronous result;
   at least one first checking synchronous flip-flop receiving the first code and supplying a third code that copies the second code; and
   a comparator for comparing the second code with the third code, and for supplying a second error signal having an active value when the second code and the third code are not identical.

8. The logic circuit according to claim 7, comprising a third module for checking the integrity of the functional flip-flop, the third module including:
   a third coding block configured to supply at least a first reference bit using the functional result;
   an inverter for supplying at least a first inverted reference bit using the first reference bit;
   at least one second checking synchronous flip-flop receiving the first reference bit and supplying a second reference bit that copies the first reference bit;
   at least one third checking synchronous flip-flop receiving the first inverted reference bit and supplying a third reference bit that copies the first inverted reference bit; and
   a comparator for comparing the second reference bit and the third reference bit and for supplying a third error signal having an active value when the second reference bit and the third reference bit are identical.

9. The logic circuit according to claim 8 wherein:
   the third coding block is configured to receive all or part of the functional result and supply a code forming the first reference bit.

10. The logic circuit according to claim 8, further comprising:
    a logic gate for combining the second error signal and the third error signal and for supplying a general error signal having an active value when at least the second or the third error signal has the active value.

11. The logic circuit according to claim 7 wherein the first coding block of the second checking module is configured to supply a first reference bit to a third module for checking the integrity of the functional flip-flop, the third module including:
- an inverter configured to supply at least a first inverted reference bit using the first reference bit;
- at least one second checking synchronous flip-flop receiving the first reference bit and supplying a second reference bit that copies the first reference bit;
- at least one third checking synchronous flip-flop receiving the first inverted reference bit and supplying a third reference bit that copies the first inverted reference bit; and
- a comparator for comparing the second reference bit and the third reference bit and for supplying a third error signal having an active value when the second reference bit and the third reference bit are identical.

12. The logic circuit according to claim 2 wherein at least one of the coding blocks comprises a circuit supplying a parity bit.

13. The logic circuit according to claim 2 wherein at least one of the coding blocks comprises a circuit supplying a Hamming code.

14. The logic circuit according to claim 1 wherein the functional and checking flip-flops are driven by a common clock signal.

15. The logic circuit according to claim 1 wherein the functional flip-flops are driven by a first clock signal and the checking flip-flops are driven by a second clock signal that is taken to the checking flip-flops via a specific clock path.

16. The logic circuit according to claim 1, further comprising:
- a plurality of logic modules;
- a plurality of checking modules each associated with a logic module, and each supplying an error signal; and
- logic gates for gathering together the error signals supplied by the plurality of checking modules, and for supplying a general error signal.

17. The logic circuit according to claim 1 wherein the reduced asynchronous logic block is configured to perform, relative to its inputs, an identical logic function as the functional asynchronous logic block.

18. An integrated circuit, comprising:
- a first logic module, including:
  - a first asynchronous logic block configured to receive an input signal having a number of bits and to produce an asynchronous result based at least in part on functional logic applied to the input signal; and
  - a first synchronous logic block configured to produce a synchronous result based at least in part on the asynchronous result; and
- a reduced checking module configured to monitor less than all of the bits of the input signal and at least part of the synchronous result and to produce a first error signal based at least in part on corresponding functional logic applied to the monitored bits of the input signal and the at least part of the synchronous result.

19. The integrated circuit of claim 18 wherein the synchronous result comprises a plurality of data bits and the reduced checking module is configured to monitor a subset of the plurality of data bits.

20. The integrated circuit of claim 18 wherein the input signal comprises a plurality of signals and wherein one of the plurality of signals is the synchronous result.

21. The integrated circuit of claim 18 wherein the input signal comprises a plurality of input signals each having a plurality of bits and the reduced checking module comprises:
- a plurality of flip-flops coupled to the plurality of input signals and configured to produce a plurality of checking input signals, each having fewer bits than a corresponding signal in the plurality of input signals;
- a second asynchronous logic block configured to receive the plurality of checking input signals and to produce a reduced synchronous result having fewer bits than the synchronous result; and
- a comparator configured to produce the first error signal based at least in part on the reduced synchronous result and the at least part of the synchronous result.

22. The integrated circuit of claim 21 wherein the plurality of flip-flops are coupled to the plurality of input signals through a plurality of reduced coding blocks configured to produce the plurality of checking input signals.

23. The integrated circuit of claim 21 wherein the reduced checking module further comprises:
- a first coding block coupled between the second asynchronous logic block and the comparator and configured to produce a first coded signal; and
- a second coding block configured to receive the synchronous result and to produce a second coded signal, wherein the comparator is configured to compare the first coded signal to the second coded signal.

24. The integrated circuit of claim 18, further comprising:
- a second checking module configured to monitor the asynchronous result and to produce a second error signal based at least in part on the asynchronous result.

25. The integrated circuit of claim 24 wherein the second checking module is configured to monitor the synchronous result and to produce the second error signal based at least in part on the asynchronous result and the synchronous result.

26. The integrated circuit of claim 24 wherein the second checking module is further configured to monitor the synchronous result and to produce a third error signal based at least in part on the asynchronous result and the synchronous result.

27. The integrated circuit of claim 24, further comprising a general error module configured to generate a general error signal based at least in part on the first error signal and the second error signal.

28. The integrated circuit of claim 18, further comprising:
- a second logic module that includes:
  - a second asynchronous logic block configured to receive a second input signal and to produce a second asynchronous result based at least in part on the second input signal; and
  - a second synchronous logic block configured to produce a second synchronous result based at least in part on the second asynchronous result; and
- a second reduced checking module configured to monitor less than all of a number of bits of the second input signal and at least part of the second synchronous result and to produce a second error signal based at least in part on the monitored bits of the second input signal and the at least part of the second synchronous result.

29. The integrated circuit of claim 28, further comprising a general error module configured to generate a general error signal based at least in part on the first and second error signals.

30. A method of checking an integrity of an integrated circuit, comprising:
- monitoring an input signal to a first logic module of the integrated circuit, the input signal comprising a plurality of data bits;
- monitoring a synchronous output signal of the first logic module, the output signal comprising a plurality of data bits generated by applying a logic function to the plurality of data bits of the input signal;

generating a reduced input signal based on the monitored input signal, the reduced input signal having fewer bits than the monitored input signal;

generating a reduced synchronous signal based on an application of a corresponding logic function to the reduced input signal, the reduced synchronous signal having fewer bits than the monitored synchronous output signal; and generating a first error signal based at least in part on the reduced synchronous signal and the synchronous output signal.

31. The method of claim 30, further comprising:

monitoring an asynchronous signal generated by the first logic module; and generating a second error signal based at least in part on the asynchronous signal generated by the first logic module.

32. The method of claim 30, further comprising:

monitoring a second input signal to a second logic module of the integrated circuit;

monitoring a second synchronous output signal of the second logic module;

generating a second synchronous checking signal; and generating a second error signal based at least in part on the second synchronous checking signal and the second synchronous output signal.

33. The method of claim 30 wherein the monitoring a synchronous output signal of the first logic module comprises monitoring a subset of the plurality of data bits of the synchronous output signal of the first logic module.

34. An integrated circuit, comprising:

a first logic block that includes:
  a functional logic block configured to apply functional logic to an input signal to generate a first asynchronous signal; and
  a synchronous block configured to generate a first synchronous signal based at least in part on the first asynchronous signal; and
  a first checking block: configured to:
    generate a reduced input signal from the input signal, the reduced input signal having fewer bits than the input signal; and
    apply a corresponding functional logic to the reduced input signal and detect an error injection directed at the functional logic block.

35. The integrated circuit of claim 34, further comprising:

a second checking block configured to detect an error injection directed at the synchronous block.

36. The integrated circuit of claim 34, further comprising:

a second logic block that includes:
  a second functional logic block configured to generate a second asynchronous signal; and
  a second synchronous block configured to generate a second synchronous signal based at least in part on the second asynchronous signal; and a second checking block configured to detect an error injection directed at the second logic block.

* * * * *